June 27, 1961 B. CORNELISON ET AL 2,990,501
NOVEL HEADER OF SEMICONDUCTOR DEVICES
Filed July 10, 1958
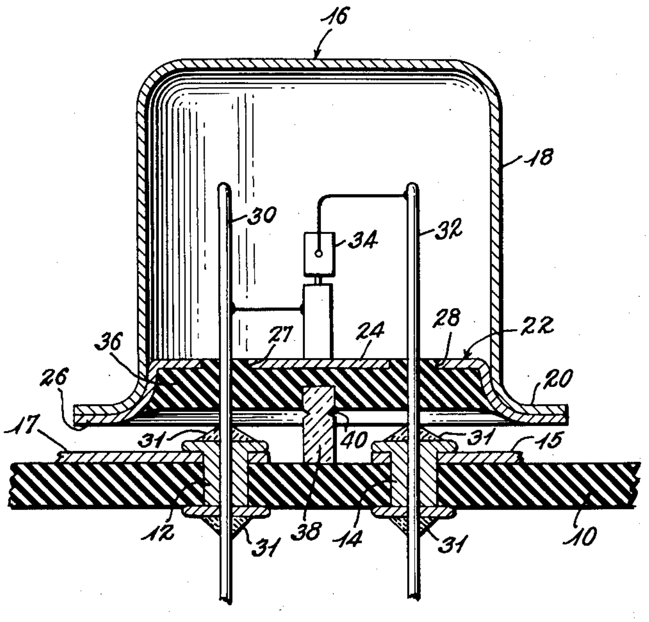
INVENTORS
BOYD CORNELISON, JAMES H. EDDLESTON,
ARTHUR D. EVANS, MARK SHEPHERD, JR.,
ROBERT L. TRENT AND ELMER A. WOLFF, JR.
BY Stevens, Davis, Miller & Mosher
ATTORNEYS 2,990,501

NOVEL HEADER OF SEMICONDUCTOR DEVICES

Boyd Cornelison, Dallas, James H. Eddleston, Richardson, and Arthur D. Evans, Mark Shepherd, Jr., and Robert L. Trent, Dallas, and Elmer A. Wolff, Jr., Richardson, Tex., assignors to Texas Instruments Incorporated, Dallas, Tex., a corporation of Delaware Filed July 10, 1958, Ser. No. 747,706
6 Claims. (Cl. 317—234)

The present invention relates to a semiconductor device and more particularly, relates to a novel header for use in mounting a semiconductor device on a support.

In one form of a semiconductor device now in frequent use, a semiconductor unit is attached to a header support consisting essentially of a metal plate through which pass leads insulated by glass beads. A can encloses the semiconductor unit and has its open end sealed to the marginal edge of the header.

Although these designs have been successful in use, a number of difficulties have been experienced especially when the device is mounted on a conductive support such as a printed circuit board. The principal problem encountered is shorting out or shunting of one or more of the header leads due to solder bridging from the support to the header conductors or a conductor and the metal portions of the header. It is to the solution of this problem that the present invention is directed. Accordingly, it is an object of the present invention to provide a semiconductor device arranged with a header of novel design which will function to space the header slightly above its mounting and thereby relieve the danger of solder bridging conductive parts.

Another object is to provide a novel header for mounting a semiconductor device wherein the over-all configuration of the header lends itself readily to the use with a printed circuit board in a "stand-off" fashion and at the same time possesses the requisite versatility whereby it can be utilized in a conventional manner.

Still another object is to provide a novel header for a semiconductor housing having a bottom surface, the central region of which is insulating material and which is formed with a frangible projection or which has a small frangible peg or rod partially embedded therein.

Still another object is to provide a novel header for mounting a semiconductor unit wherein a small frangible peg or rod is attached to and normally projects away from the bottom surface of the header, whereby when the header is mounted upon a support, the projecting peg or rod will stand the header off from the mounting surface.

Still another object is to provide a header having a stand-off peg attached thereto that is formed with an annular score mark near the point of attachment between the peg and the header to enable the peg to be easily broken off and detached when it is not used as a "stand-off" insulator.

Still another object is to provide a "stand-off" insulator for a semiconductor device that is formed of a material which can be readily broken, whereby the projecting portion of the insulator can be detached merely by exerting a small amount of pressure thereon.

Other and further objects of the present invention will become more fully apparent from the following detailed description when taken in conjunction with the sole figure of the drawing which shows the structure embodied in the present invention in a vertical sectional view.

Referring now to the drawing, a portion of a printed circuit board is indicated generally at 10 and it is understood that any desired electrical circuit may be performed on the board in a manner well known in the printed circuit art. The board 10 is formed with suitably positioned and dimensioned openings into which are positioned eyelets 12 and 14 to receive the leads of a semiconductor device generally referenced as 16. A conductive strip 15 is shown on the top surface of board 10 with eyelet 14 making contact to it. Eyelet 12 is shown contacting a strip 17. The semiconductor device 16 includes a metal can or housing 18 having a flange 20 which is attached to flange 26 of a header assembly generally indicated at 22. The header assembly 22 includes a dish-shaped metal shell 24 defining holes 27 and 28 and having an outturned annular rim or flange 26. The space within the shell 24 is filled with suitable insulating material 36. Electrical leads, indicated at 30 and 32, extend through the header assembly 22 via the openings 27 and 28, respectively, and are insulated from shell 24 by insulating material 36. The leads 30 and 32 project into the interior of the metal can or housing 18 and are electrically connected, through suitable means, to a semiconductor element, indicated at 34. The particular arrangement shown is purely for purposes of illustration as the contents of the can or housing 18 beyond the fact that it includes a semiconducting unit, forms no part of the invention.

The leads 30 and 32 are formed of a conducting material and are critically spaced, usually quite close together and due to the small dimensions generally involved, quite close to the flange of the metal shell 24 of the header assembly 22. If the assembly 16 were placed in contact with the upper surface of the printed circuit board 10, solder employed to attach leads 30 and 32 to eyelets 12 and 14, respectively, as indicated by reference numeral 31, could bridge any of the conductive parts of the assembly, causing either shunting or shorting or both. In order to avoid any possibility of solder bridging conductive parts, a "stand-off" spacer or peg 38 is provided. The "stand-off" peg 38 is formed of a frangible material, such as glass or ceramic and is fused or partially embedded into the insulating material 36 in a way that it projects outwardly from the bottom surface substantially normal thereto.

Although it is desirable to utilize the peg 38 as a "stand-off" insulating means, there are circumstances which make it preferable to position the device directly in contact with its support whereby the rim 26 is disposed in substantially flush engagement therewith. For this purpose, the peg 38 is formed with a nick or score mark 40 closely adjacent to its point of attachment to the insulating material 36. Since the peg 38 is formed of a frangible material, the projecting portion thereof may be readily detached substantially even or flush with the bottom surface of the insulating material 36, when desired.

Although the arrangement described hereinabove is considered a preferred embodiment of the invention, it will be appreciated that other arrangements are possible which do not depart from the novel concepts herein taught. For example, in place of the dish-shaped metal shell 24, a ring of metal may be bonded to a ceramic or glass disc. Also, a projection similar to peg 38 may be formed integrally with the insulating material 36 during the casting thereof. The projecting portion of the peg 38 may also be cast with a nick or score mark to permit breaking off of the projecting portion. Since the peg 38 is set into the insulating material 36, the peg itself may be formed of a conducting material if an additional conductor is necessary. Basically the preferred arrangement for the novel header of the present invention contemplates using insulating material to form the central region of the bottom surface of the header.

Although the present invention has been shown and described in terms of a single preferred embodiment, nevertheless various other changes and modifications, such as obvious to one skilled in the art, are deemed to be within the spirit, scope and contemplation of the present invention.

What is claimed is:

1. In a semiconductor device including header means for mounting a semiconductor unit, the improvement comprising a frangible stand-off means attached to said header means and projecting outwardly therefrom adapted to engage a support to maintain said semiconductor device spaced therefrom.

2. In a semiconductor device in accordance with claim 1 wherein said stand-off means is scored closely adjacent the point of attachment to said header means to enable severing thereof.

3. In a semiconductor device including header means for mounting a semiconductor unit, said header means having the central region of one surface formed of insulating material, the improvement comprising a stand-off insulating peg means attached to the central region of the surface formed of insulating material and extending outwardly therefrom to both position and space said semiconductor device from a surface on which it is adapted to be located.

4. In a semiconductor device in accordance with claim 3 wherein said header means comprises a metal shell filled with insulating material and wherein said stand-off insulating means is partially embedded in said insulating material.

5. A semiconductor device in accordance with claim 3 wherein said peg means is formed with a score mark closely adjacent its point of attachment to said header means to enable easy severing of said means.

6. A semiconductor device in accordance with claim 3 wherein said header means includes a metal shell filled with an insulating material and said peg means is defined by a projecting part of said insulating material.

References Cited in the file of this patent

UNITED STATES PATENTS

| | | |
|---|---|---|
| 1,794,037 | Shoemaker | Feb. 24, 1931 |
| 2,664,528 | Stelmak | Dec. 29, 1953 |